(12) United States Patent
Kyung

(10) Patent No.: US 6,570,803 B2
(45) Date of Patent: May 27, 2003

(54) MEMORY SYSTEM CAPABLE OF INCREASING UTILIZATION EFFICIENCY OF SEMICONDUCTOR MEMORY DEVICE AND METHOD OF REFRESHING THE SEMICONDUCTOR MEMORY DEVICE

(75) Inventor: Kye-hyun Kyung, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/151,877

(22) Filed: May 22, 2002

(65) Prior Publication Data

US 2003/0007406 A1 Jan. 9, 2003

(30) Foreign Application Priority Data

Jun. 27, 2001 (KR) .................................... 2001-0037051

(51) Int. Cl.[7] .................................................. G11C 7/00
(52) U.S. Cl. ................................. 365/222; 365/230.03
(58) Field of Search ............................. 365/222, 230.03, 365/230.06, 230.01

(56) References Cited

U.S. PATENT DOCUMENTS 5,999,472 A  * 12/1999  Sakurai ....................... 365/222
6,141,290 A  * 10/2000  Cowles et al. .............. 365/222
6,233,192 B1 *  5/2001  Tanaka ........................ 365/222

* cited by examiner

Primary Examiner—Michael S. Lebentritt
Assistant Examiner—Anh Phung
(74) Attorney, Agent, or Firm—Harness, Dickey & Pierce, P.L.C.

(57) ABSTRACT

A memory system, which is capable of increasing the utilization efficiency of a semiconductor memory device, and a method of refreshing the semiconductor memory device are provided. The memory controller can selectively perform a refresh operation on a particular bank by applying a refresh command without also applying a bank address, and thus it is possible to increase the utilization efficiency of a semiconductor memory device.

23 Claims, 4 Drawing Sheets

MEMORY SYSTEM CAPABLE OF INCREASING UTILIZATION EFFICIENCY OF SEMICONDUCTOR MEMORY DEVICE AND METHOD OF REFRESHING THE SEMICONDUCTOR MEMORY DEVICE

FIELD OF THE INVENTION

The present invention relates to a memory system, and more particularly, to a memory system which is capable of increasing the utilization efficiency of a semiconductor memory device and a method of refreshing the semiconductor memory device.

BACKGROUND OF THE INVENTION

Dynamic random accesses memory (DRAM) devices must periodically perform refresh operations. As the storage capacity of memories increases, the time taken to perform a refresh operation increases. When performing a refresh operation, a semiconductor memory device cannot perform other operations. Here, the increase in the time taken for a semiconductor memory device to perform a refresh operation means that a refresh operation accounts for a larger percentage of all operations to be performed by the semiconductor memory device. In other words, a refresh operation makes up a larger percentage of the entire operational time of a DRAM, and thus the utilization efficiency of a memory decreases.

For example, in the case of a 256 Mbit synchronous dynamic random access memory (SDRAM) operating at a frequency of 100 MHz with a refresh time tRFC of 70 ns and a refresh interval of 32 ms and having a page size of 1 Kbyte, the percentage of time necessary for a refresh operation with respect to the total operational time of the SDRAM can be obtained from Equation (1) which assumes a ratio of 8 bits per byte. Here, the refresh time tRFC represents the minimum time taken to activate a wordline and precharge the wordline during a refresh operation.

$$\frac{256 \text{ Mbit}}{1 \text{ KByte}} \times \frac{70 \text{ ns}}{32 \text{ ms}} = 7.168\% \quad (1)$$

For a 4 Gbit SDRAM operating at a frequency of 100 MHz with a refresh time tRFC of 70 ns and a refresh interval of 32 ms and having a page size of 4 Kbyte, the percentage of time necessary for a refresh operation with respect to the total operational time of the SDRAM can be obtained from Equation (2).

$$\frac{4 \text{ Gbit}}{4 \text{ Kbyte}} \times \frac{70 \text{ ns}}{32 \text{ ms}} \times 100 = 28.672\% \quad (2)$$

Referring to Equations (1) and (2), as the memory capacity of a semiconductor memory device increases, the time taken to perform a refresh operation increases.

For currently-used SDRAMs, in order to perform a refresh operation, all banks must be precharged. Thus, in order to re-access a bank which has already been accessed prior to the refresh operation, after the refresh operation, a delay time of as much as tRFC+tRAC is required. Here, tRAC represents the time taken to access memory cells in a wordline after a row active command comes into effect on the wordline.

A solution to the problem of increased time taken to perform a refresh operation can be to provide an SDRAM that is adapted to perform a refresh operation on one bank while performing an operation other than a refresh operation on another bank. However, in order to selectively refresh a particular bank, the address of the particular bank to be refreshed must be applied with a refresh command. In other words, an address field, which indicates the address of the particular bank to be refreshed, must be defined in a refresh operation, and thus the bit efficiency of the refresh operation decreases.

SUMMARY OF THE INVENTION

The present invention, in part according to an embodiment, provides a memory system which is capable of increasing the utilization efficiency of a semiconductor memory device by enabling the semiconductor memory device to selectively refresh fewer, e.g., one of the, banks without having to supply the address of the to-be-refreshed bank in addition to the refresh command. As such, it is possible to substantially simultaneously access banks not currently undergoing the refresh operation, i.e., while performing the refresh operation on the selected bank.

The present invention, also in part according to an embodiment, provides a method of refreshing the semiconductor memory device in the memory system.

The invention, also in part according to an embodiment, provides a memory system comprising: a plurality of semiconductor memory devices, each of which comprises a plurality of banks, each semiconductor memory device being operable to generate the address of a bank to be refreshed next and the address of a wordline to be refreshed as a second refreshed bank address and a refreshed row address, respectively, and to refresh a wordline of a bank corresponding to the second refreshed bank address and the refreshed row address; and a memory controller which generates and outputs a refresh command to the plurality of semiconductor memory devices and generates a first refreshed bank address, which is the same as the second refreshed bank address, in response to the refresh command.

The invention, also in part according to an embodiment, provides a method of refreshing a semiconductor memory device in a memory system comprising a plurality of semiconductor memory devices and a memory controller for controlling the semiconductor memory devices, each semiconductor memory device including a plurality of banks, the method comprising: (a) generating, via the memory controller, the address of a bank to be refreshed as a first refreshed bank address and substantially simultaneously generating, via the semiconductor memory devices, the address of the bank to be refreshed as a second refreshed bank address; and (b) refreshing a bank corresponding to the second refreshed bank address.

The invention, also in part according to an embodiment, provides a method of controlling a memory device to substantially simultaneously undergo a refresh operation and another, non-refresh, operation, the memory device being organized into a plurality of banks, the refresh operation progressing on a bank-by-bank basis, the method comprising: providing a refresh command to the memory device without also providing to the memory device an indication of a corresponding bank address therein initially targeted for refreshing, the refresh command initiating the refresh operation; and providing at least one non-refresh command to the memory device that targets at least one bank in the memory device other than the bank next targeted for refreshing.

The invention, also in part according to an embodiment, provides a memory system comprising: a memory device organized into a plurality of banks; and a memory controller to control the memory device; wherein the memory controller is operable to provide a refresh command to the memory device without also providing to the memory device an indication of a corresponding bank address therein initially targeted for refreshing, the refresh command initiating the refresh operation, the refresh operation progressing on a bank-by-bank basis; and wherein the memory controller is operable to provide at least one non-refresh command to the memory device that targets at least one bank in the memory device other than the bank next targeted for refreshing such that the memory device is controlled to substantially simultaneously undergo a refresh operation and the non-refresh operation.

Additional features and advantages of the invention will be more fully apparent from the following detailed description of the preferred embodiments, the appended claims and the accompanying drawings.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, a memory system which is capable of increasing the utilization efficiency of a semiconductor memory device and a method of refreshing the semiconductor memory device will be described more fully with reference to the accompanying drawings.

Figure 1:
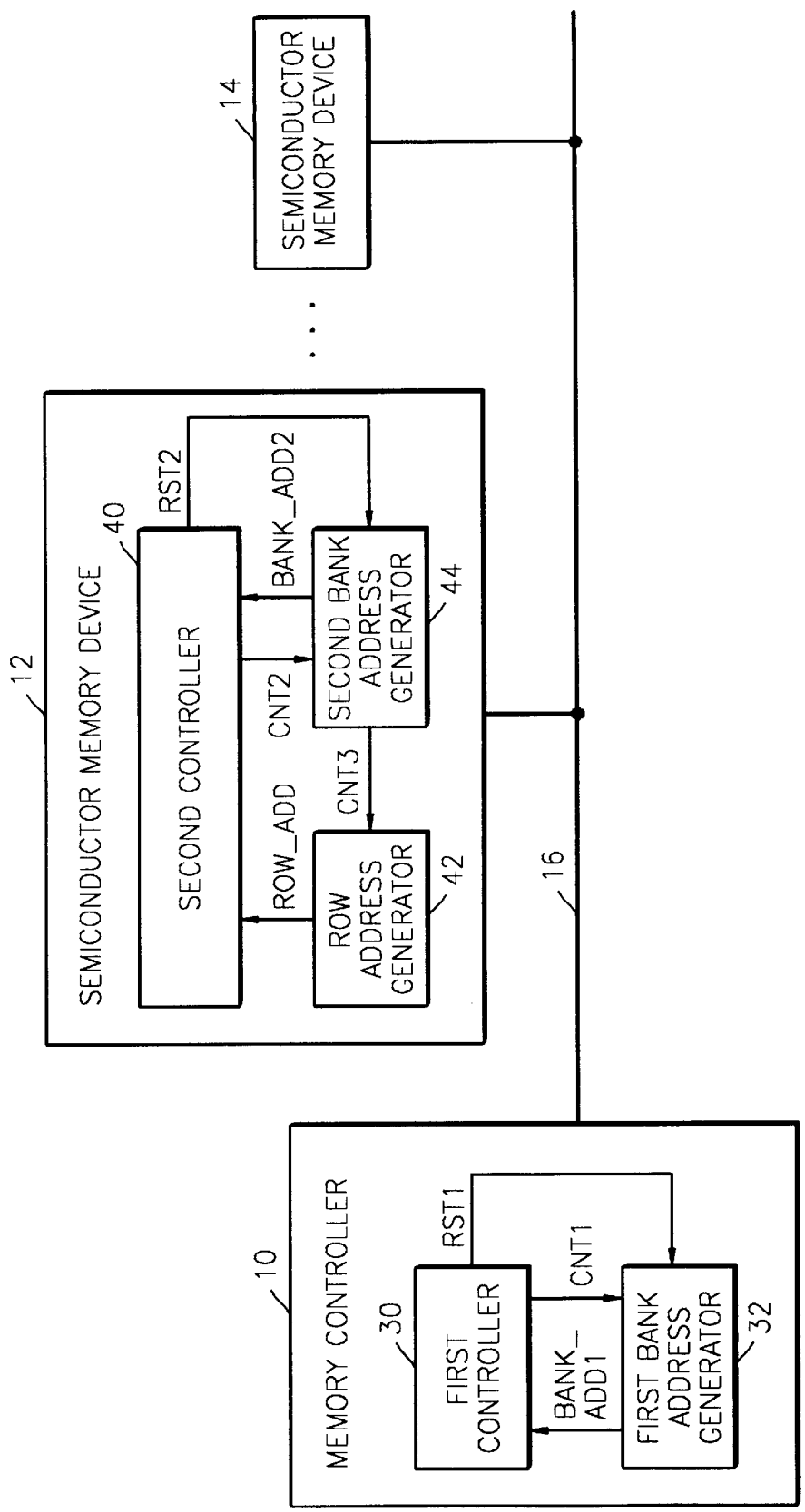
FIG. 1 is a block diagram of a memory system which is capable of increasing the utilization efficiency of a semiconductor memory device according to an embodiment of the present invention.

FIG. 1 is a block diagram of a memory system which is capable of increasing the utilization efficiency of a semiconductor memory device according to an embodiment of the present invention. In the memory system shown in FIG. 1, a memory controller 10 is connected to a plurality of semiconductor memory devices 12 and 14 via a memory bus 16. The memory region of each of the semiconductor memory devices 12 and 14 includes n banks (not depicted) ranging from Bank 1 to Bank n. For the convenience of explanation, it is supposed that Bank 1 is accessed by the lowest bank address and Bank n is accessed by the greatest bank address; other mappings could be used.

The memory controller 10 controls the operations of the semiconductor memory devices 12 and 14 by applying control commands via the memory bus 16. The memory controller 10 periodically applies a refresh command, among all control commands for controlling the operations of the semiconductor memory devices 12 and 14, thus refreshing the semiconductor memory devices 12 and 14.

The memory controller 10 generates a bank address to be refreshed next in the semiconductor memory device 12 as a first refreshed bank address BANK_ADD1 when the memory controller 10 applies the refresh command.

The memory controller 10 can find the address of a bank that is to be refreshed next via reference to the first refreshed bank address BANK_ADD1 and so can also find the address of the banks that will not be undergoing the refresh operation. Hence, the memory controller 10 can apply control commands other than a refresh command to the banks that will not be undergoing the refresh operation.

In response to the refresh command, the bank address BANK_ADD1 will iteratively be set to one of a plurality of addresses ranging from a start address to a final address generated, typically, in a predetermined order. Here, the start address and the final address are determined by an order of banks to be refreshed. In other words, in a case where a plurality of banks having addresses ranging from the lowest bank address to the greatest bank address are sequentially refreshed, the start address is the lowest bank address, and the final address is the greatest bank address.

The memory controller 10 generates a first reset signal RST1 in response to a self-refresh completion command or when the memory system is turned on, and then the first refreshed bank address BANK_ADD1 is initialised to a start address in response to the first reset signal RST1. Preferably, the memory controller 10 includes a first controller 30 and a first bank address generator 32.

The first controller 30 generates the first reset signal RST1 for initialising the first bank address generator 32. The first controller 30 generates the first reset signal RST1 in response to a self-refresh completion command or when the memory system is turned on. The first controller 30 generates a first count signal CNT1, which is enabled in response to a refresh operation, and outputs the first count signal CNT1 to the first bank address generator 32. In addition, the first controller 30 receives the first refreshed bank address BANK_ADD1 from the first bank address generator 32. The first controller 30 can find which bank ADD1 will be performed next in the semiconductor memory devices 12 and 14 with reference to the first refreshed bank address BANK_ADD1. Accordingly, the first controller 30 can apply control commands other than a refresh command to banks upon which a refresh operation is not being performed in the semiconductor memory devices 12 and 14.

The first bank address generator 32 repeatedly generates the first refreshed bank address BANK_ADD1 within a range between a start address and a final address in response to the first count signal CNT1. In addition, the first bank address generator 32 is initialised to the start address in response to the first reset signal RST1. For example, if the first bank address generator 32 generates the first refreshed bank address BANK_ADD1 which is up-counted in response to the first count signal CNT1, addresses for indicating bank 1, bank 2, bank 3, . . . , bank n, bank 1, bank 2, . . . are sequentially generated as the first refreshed bank address BANK_ADD1.

As described above, each of the semiconductor memory devices 12 and 14 includes n banks (not depicted) and is controlled by control commands applied over the bus 16 by the memory controller 10. If a refresh command is applied to the semiconductor memory devices 12 and 14, then each of the semiconductor memory devices 12 and 14 generates a second refreshed bank address used to perform a refresh operation in response to the refresh command. The semiconductor memory devices 12 and 14 are synchronized with the memory controller 10, and thus the second refreshed bank address BANK_ADD2 has the same value as the first refreshed bank address BANK_ADD1.

Each of the semiconductor memory devices 12 and 14 initialise the second refreshed bank address BANK_ADD2 to a start address in response to the first reset signal RST1 generated by the memory controller 10 and applied over the bus 16. If the second refreshed bank address BANK_ADD2 generated in each of the semiconductor memory devices 12 and 14 equals a final address, a new value for the row address (upon which a refresh operation is to be performed) is generated as a refreshed row address ROW_ADD. When the second refreshed bank address BANK_ADD2 reaches a value equal to the final address, a plurality of addresses ranging from a start row address to a final row address are sequentially generated as the refreshed row address ROW_ADD. Here, the start row address and the final row address are determined according to the order of wordlines to be refreshed. For example, in a case where a plurality of addresses ranging from the start row address to the final row address are sequentially generated as the refreshed row address ROW_ADD, the start row address is the lowest row address, and the final row address is the greatest row address.

The semiconductor memory devices 12 and 14 refresh a wordline which belongs to a particular row indicated by the refreshed row address ROW_ADD and a particular bank indicated by the second refreshed bank address BANK_ADD2. The other banks upon which a refresh operation is not being performed can simultaneously undergo operations other than a refresh operation, e.g., under control by the memory controller 10.

Preferably, each of the semiconductor memory devices 12 and 14 includes a second controller 40, a row address generator 42, and a second address generator 44. Hereinafter, the structure and operation of the semiconductor memory device 12 will be described. Since the semiconductor memory device 14 has the same structure and operational characteristics as the semiconductor memory device 12, the detailed description of the semiconductor memory device 14 will be omitted for convenience.

The second controller 40 generates a second count signal CNT2, which is enabled by a refresh command applied by the memory controller 10, and outputs the second count signal CNT2 to the second bank address generator 44. The second controller 40 refreshes a wordline of a bank corresponding to the second bank address BANK_ADD2 generated by the second bank address generator 44 and the refreshed row address ROW_ADD generated by the row address generator 42. In addition, the second controller 40 generates a second reset signal RST2 for initialising the second bank address generator 44. Here, the second reset signal RST2 is generated when the memory system is turned on or when a self-refresh completion command is applied by the memory controller 10. The semiconductor memory device 12 enables the second count signal CNT2 at predetermined time intervals when a self-refresh command is applied by the memory controller 10. According to the control of the memory controller 10, the second controller 40 allows operations other than a refresh operation to be performed on banks that do not have a refresh operation currently being performed upon them.

The second bank address generator 44 generates the second refreshed bank address BANK_ADD2, which is used to perform a refresh operation, in response to the second count signal CNT2 and is initialised to an initial value in response to the second reset signal RST2. As described above, the second refreshed bank address BANK_ADD2 generated in response to a refresh command is the same as the first refreshed bank address BANK_ADD1 generated inside the memory controller 10. Thus, the second bank address generator 44 and the first bank address generator 32 can have the same characteristics. In addition, when generating a final address, the second bank address generator 44 is initialised in response to the second count signal CNT2 to be enabled next and simultaneously generates a third count signal CNT3 applied to the row address generator 42.

The row address generator 42 generates a row address to be refreshed as the refreshed row address ROW_ADD in response to the third count signal CNT3 and outputs the row address to the second controller 40. For example, if the row address generator 42 sequentially generates refreshed row addresses in ascending series, the row address generator 42 sequentially generates refreshed row addresses for indicating row 1, row 2, ..., row N-1, and row N. In other words, all banks allotted to one wordline are sequentially refreshed, and thus it is possible to prevent one bank from being subjected to a refresh operation for a long time.

As described above, when the memory controller 10 applies a refresh command to the semiconductor memory devices 12 and 14, the memory controller 10 is synchronized with the semiconductor memory devices 12 and 14, and each of the semiconductor memory devices 12 and 14 generates a refreshed bank address to be refreshed. In other words, the memory controller 10 can apply a refresh command to refresh a particular bank of the semiconductor memory devices 12 and 14 without also specifying a bank address because of the first refresh bank address BANK_ADD1 maintained in the memory controller 10 and the corresponding second refresh bank address BANK_ADD2 maintained in each of the memory devices 12 and 14. Accordingly, the memory controller 10 can access bank addresses at which a refresh operation is not being performed by referring to the first refreshed bank address BANK_ADD1 and can control operations other than a refresh operation. Therefore, each of the semiconductor memory devices 12 and 14 can be controlled, via the memory controller 10, to substantially simultaneously perform a refresh operation and a different operation, and thus the utilization efficiency of the semiconductor memory devices 12 and 14 can be increased.

Referring to FIG. 1, if the memory controller 10 applies a self-refresh command to the semiconductor memory devices 12 and 14, the semiconductor memory devices 12 and 14 operate in a self-refresh mode. If the memory controller 10 applies a self-refresh completion command to the semiconductor memory devices 12 and 14, the semiconductor memory devices 12 and 14 terminate the self-refresh mode. When the semiconductor memory device 12 is operating in a self-refresh mode, the first count signal CNT1 is not enabled, and thus the first bank address generator 32 still maintains the address value of the time before the self-refresh command came into effect.

On the other hand, the second controller 40 of the semiconductor memory device 12 generates the second count signal CNT2, which is periodically enabled, in response to a self-refresh command. In other words, the second bank address generator 44 repeatedly generates the second refreshed bank address BANK_ADD2 in response to the second count signal CNT2 and performs a self-refresh operation while in a self-refresh mode.

Figure 2:
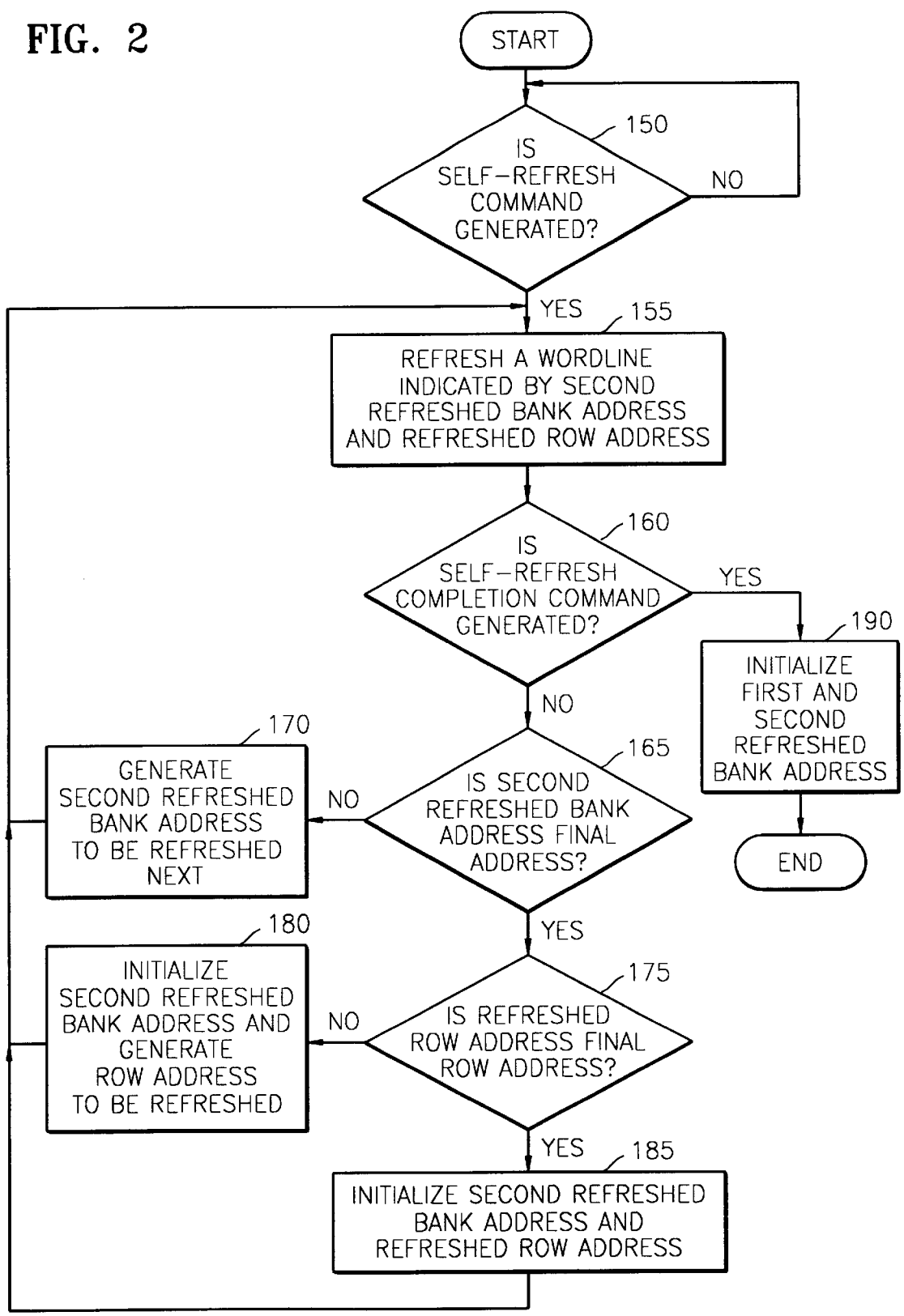
FIG. 2 is a flow chart of a self-refresh method according to an embodiment of the present invention, e.g., as can be performed in the memory system shown in FIG. 1.

FIG. 2 is a flow chart of a self-refresh method performed in the semiconductor memory device shown in FIG. 1 according to an embodiment of the present invention. The semiconductor memory devices 12 and 14 operate in a self-refresh mode in response to a self-refresh command generated by the memory controller 10 and end the self-refresh operation in response to a self-refresh completion command.

Hereinafter, a self-refresh operation of the semiconductor memory device shown in FIG. 1 will be described more fully with reference to FIGS. 1 and 2. First of all, it is determined whether or not a self-refresh command is applied by the memory controller 10 onto each of the semiconductor memory devices 12 and 14 in step 150.

If the self-refresh command is generated by the first controller 30 of the memory controller 10 in step 150, each of the semiconductor memory devices 12 and 14 refreshes a wordline of a particular bank indicated by the second refreshed bank address BANK_ADD2 and the refreshed row address ROW_ADD in step 155.

After step 155, it is determined whether or not a self-refresh completion command is applied by the memory controller 10 onto the semiconductor memory devices 12 and 14 in step 160. If the self-refresh completion command is applied to the semiconductor memory devices 12 and 14, the memory controller 10 generates the first reset signal RST1, initialises the first and second bank address generators 32 and 44 in step 190, and completes the self-refresh operation of each of the semiconductor memory devices 12 and 14.

If the self-refresh completion command is not applied in step 160, the semiconductor memory device 12 determines whether or not the bank corresponding to a final address is refreshed in step 165. In step 165, if the bank corresponding to the final address has not yet been refreshed, the semiconductor memory device 12 generates a new value in step 170 for the second refreshed bank address BANK_ADD2 in response to the second count signal CNT2, which is periodically enabled, to identify the bank that will be refreshed next. On the other hand, if the bank corresponding to the final address is refreshed in step 165, the second bank address generator 44 determines whether or not a final row address is refreshed in step 175.

If the row that has been refreshed is determined in step 175 to not be equal to the final row address, then the second bank address generator 44 is reset and simultaneously generates the third count signal CNT3. The row address generator 42 generates a refreshed row address in response to the third count signal CNT3 in step 180 to perform a refresh operation. On the other hand, if it is determined in step 175 that the final row address has been refreshed, the second bank address generator 44 and the row address generator 42 are initialised and generate an initial address and an initial row address, respectively, in step 185. Then, the process returns to step 155.

Figure 3:
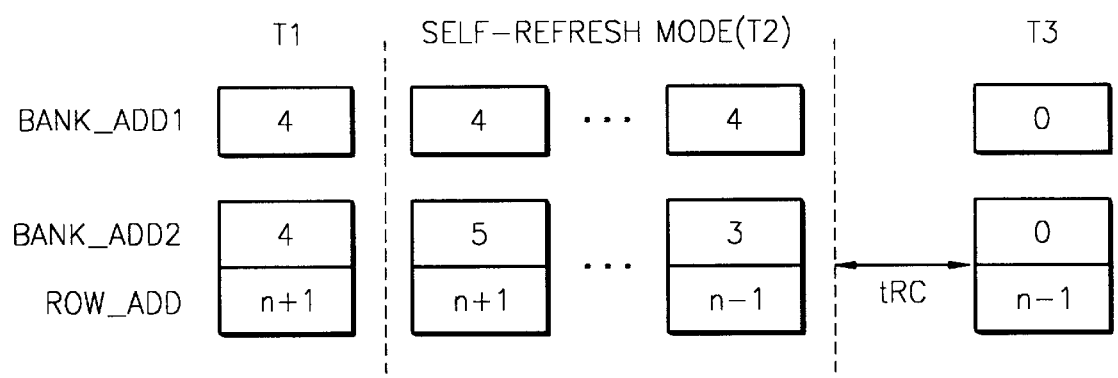
FIG. 3 is a diagram illustrating refreshed bank addresses generated before and after the semiconductor memory device shown in FIG. 1 is in a self-refresh mode.

FIG. 3 is a diagram illustrating the operations of the first and second address generators 32 and 44 before and after the semiconductor memory device 12 shown in FIG. 1 is in a self-refresh mode. Referring to FIG. 3, a first section T1 and a third section T3 are sections in which the semiconductor memory device 12 performs a refresh operation in response to a refresh command, and a second section T2 is a section in which the semiconductor memory device 12 performs a self-refresh operation in response to a self-refresh command.

Referring to FIGS. 1 and 3, in the first section T1, the first and second bank address generators 32 and 44 operate in synchronization with each other. Thus, as shown in FIG. 3, the first and second refreshed bank addresses BANK_ADD1 and BANK_ADD2 represent the address of bank 4. However, if a self-refresh command is generated by the memory controller 10, the mode of the semiconductor memory device 12 becomes a self-refresh mode. Since a refresh command is not generated in the second section T2, where the semiconductor memory device 12 is in a self-refresh mode, the first bank address generator 32 maintains the first refreshed bank address BANK_ADD1 of the time before the self-refresh command is applied. On the other hand, the second bank address generator 44 continuously generates the second refreshed bank address BANK_ADD2 in response to the second count signal CNT2, which is periodically generated in the second controller 40. If a self-refresh completion command is generated by the memory controller 10, the memory controller 10 and the semiconductor memory device 12 generate the first and second reset signals RST1 and RST2 in response to the self-refresh completion command, thus initialising the first and second bank address generators 32 and 44. As shown in FIG. 3, in the third section T3, where the semiconductor memory device 12 terminates the self-refresh mode, the first and second bank address generators 32 and 44 are initialised, and initial addresses (in FIG. 3, e.g., bank 0 is an initial address) are generated as the first and second refreshed bank addresses BANK_ADD1 and BANK_ADD2.

In other words, when the semiconductor memory device 12 operates in the self-refresh mode, the first and second bank address generators 32 and 44 are not synchronized with each other and generate different refreshed bank addresses. If the semiconductor memory device 12 terminates the self-refresh mode, the first and second bank address generators 32 and 44 are simultaneously reset, thus synchronizing the first and second bank address generators 32 and 44 with each other in a manual refresh mode.

The first and second refreshed bank addresses BANK_ADD1 and BANK_ADD2 have been described as accessing one bank. However, the first and second refreshed bank addresses BANK_ADD1 and BANK_ADD2 can access two or more banks. In other words, if a plurality of banks are divided into several groups, the first and second refreshed bank addresses BANK_ADD1 and BANK_ADD2 can be used to access each of the several groups. Thus, a plurality of banks constituting each of the several groups can be simultaneously accessed and refreshed.

Figure 4:
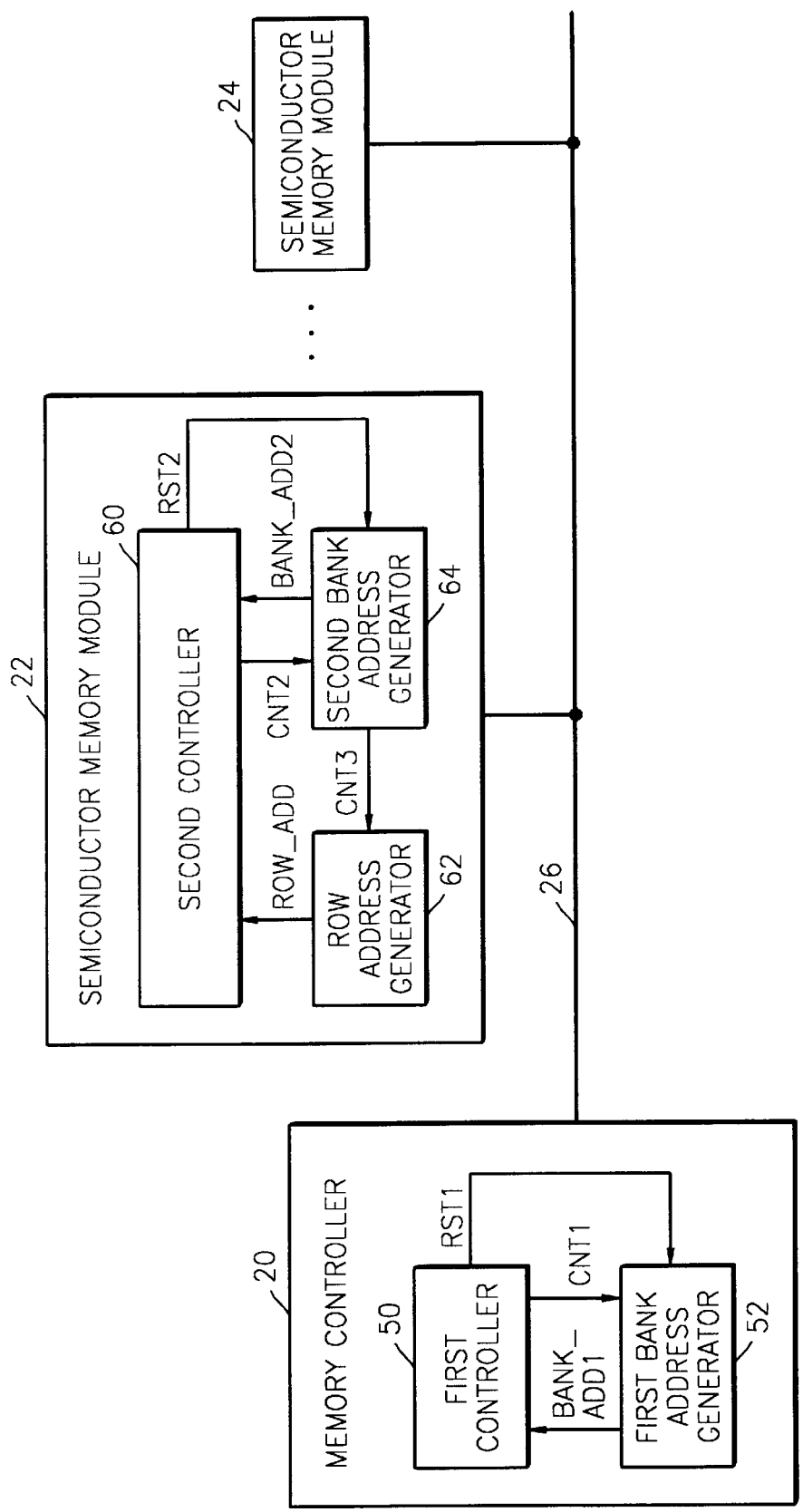
FIG. 4 is a block diagram of a memory system according to another embodiment of the present invention in which a memory controller is connected to a plurality of semiconductor memory modules via a memory bus.

FIG. 4 is a block diagram of a memory system according to another embodiment of the present invention in which a memory controller 20 is connected to a plurality of semiconductor memory modules 22 and 24 via a memory bus 26. Here, each of the memory modules 22 and 24 includes a plurality of semiconductor memory devices (not depicted). Each of the semiconductor memory devices has the same structure and operational characteristics as the semiconductor memory device 12 shown in FIG. 1 and thus will not be described again.

According to the memory system of FIG. 4 which is capable of increasing the utilization efficiency of a semiconductor memory device and a method of refreshing the semiconductor memory device, the memory controller 20 can selectively refresh a particular bank by applying a refresh command without also applying a bank address and can control the operations of the other banks upon which a refresh operation is not being performed. As a result, in the semiconductor memory device including a plurality of banks, banks that do not have a refresh operation currently performed can have operations other than the refresh operation being performed upon them, thus increasing the utilization efficiency of the semiconductor memory device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A memory system comprising:
    a plurality of semiconductor memory devices, each of which comprises a plurality of banks, each memory device being operable to generate the address of a bank to be refreshed next and the address of a wordline to be refreshed as a second refreshed bank address and a refreshed row address, respectively, and to refresh a wordline of a bank corresponding to the second refreshed bank address and the refreshed row address; and
    a memory controller which generates and outputs a refresh command to the plurality of semiconductor memory devices and generates a first refreshed bank address, which is the same as the second refreshed bank address, in response to the refresh command.

2. The memory system of claim 1, wherein the memory controller applies control commands, for controlling the operation of banks not undergoing a refresh operation, to the plurality of semiconductor memory devices based, in part, upon the first refreshed bank address.

3. The memory system of claim 1, wherein each of the plurality of semiconductor memory devices generates the second refreshed bank address in response to the refresh command, initializes the second refreshed bank address to an initial address in response to the refresh command if the second refreshed bank address reaches a final address, and substantially simultaneously generates the refreshed row address.

4. The memory system of claim 1, wherein the memory controller comprises:
    a first bank address generator which generates the first refreshed bank address in response to a first count signal; and
    a first controller which generates the first count signal, which is enabled in response to the refresh command, and generates the control command for controlling the operations of the banks not undergoing a refresh operation.

5. The memory system of claim 4, wherein the first controller generates and outputs a self-refresh command and a self-refresh completion command to the plurality of semiconductor memory devices and generates and outputs a first reset signal for initializing the first refreshed bank address to an initial address to the first bank address generator in response to the self-refresh completion command, and each of the plurality of semiconductor memory devices generates the second refreshed bank address at predetermined time intervals in response to the self-refresh command and initializes the second refreshed bank address to the initial address in response to the first reset signal.

6. The memory system of claim 1, wherein each of the plurality of semiconductor memory devices comprises:
    a second bank address generator which generates the second refreshed bank address in response to a second count signal and generates a third count signal, which is enabled when the second refreshed bank address is initialized from the final address to the initial address, in response to the second count signal;
    a row address generator which generates the refreshed row address in response to the third count signal; and
    a second controller which generates the second count signal, which is enabled in response to the refresh command, refreshes the wordline of the bank corresponding to the second refreshed bank address and the refreshed row address, and controls the operations of the banks not undergoing a refresh operation according to commands applied by the memory controller.

7. The memory system of claim 6, wherein the second controller provides the second count signal at predetermined time intervals in response to the self-refresh command applied by the memory controller and initializes the second refreshed bank address to the initial address if the self-refresh completion command is applied to the second controller.

8. The memory system of claim 1, wherein the plurality of banks are divided into two or more groups, and the first and second refreshed bank addresses are for accessing each of the groups.

9. A method of refreshing a semiconductor memory device in a memory system comprising a plurality of semiconductor memory device, each of which comprises a plurality of banks and a memory controller for controlling the semiconductor device, the method comprising:
    (a) generating, via the memory controller, the address of a bank to be refreshed as a first refreshed bank address and substantially simultaneously generating, via the semiconductor memory devices, the address of the bank to be refreshed as a second refreshed bank address if a refresh command is generated by the memory controller; and
    (b) refreshing a bank corresponding to the second refreshed bank address.

10. The method of claim 9 further comprising applying, via the memory controller, at least one non-refresh type of control command to banks identified relative to the first refreshed bank address as not currently undergoing a refresh operation.

11. The method of claim 9 further comprising:
    periodically generating, via the plurality of semiconductor memory devices, the second refreshed bank address if the memory controller applies a self-fresh completion command to the semiconductor memory device; and
    initializing, via the memory controller, the first refreshed bank address and substantially simultaneously initializing, via the plurality of semiconductor memory devices, the second refreshed bank address.

12. A method of refreshing a semiconductor memory device in a memory system comprising a plurality of semiconductor memory devices and a memory controller, each memory device including a plurality of banks, each memory device generating a refreshed bank address in response to a refresh command generated by the memory controller, and the memory controller which controls the semiconductor memory devices and generates the refreshed bank address in response to the refresh command, the method comprising:
    (a) refreshing a wordline of a bank corresponding to the refreshed bank address and a refreshed row address to be refreshed;
    (b) determining whether or not a bank corresponding to a final address is being refreshed;
    (c) generating a refreshed bank address to be refreshed next in response to the refresh command and performing step (a) again if the bank corresponding to the final address is determined not to be being refreshed in step (b);
    (d) determining whether a final row address is being refreshed if the bank corresponding to the final address is being refreshed in step (b);

(e) initializing the refreshed bank address to an initial address in response to the refresh command and performing step (a) again if the final row address was not refreshed in step (d); and (f) initializing the refreshed bank address to the initial address, substantially simultaneously initializing the refreshed row address to an initial row address in response to the refresh command, and performing step (a) again if the final row address was refreshed in step (d).

13. The method of claim 12, wherein the plurality of banks are divided into two or more groups and the refreshed bank address is for accessing each of the groups.

14. The method of claim 12 further comprising applying control commands, via the memory controller, that are for controlling banks not undergoing a refresh operation, to the semiconductor memory devices based, in part, upon the refreshed bank address.

15. The method of claim 12 further comprising:

(g) refreshing a wordline of a bank corresponding to the refreshed bank address and the refreshed row address in response to the self-refresh command generated by the memory controller;

(h) determining whether a self-refresh completion command has been applied by the memory controller;

(i) determining whether the bank corresponding to the final address is being refreshed if the self-refresh completion command is determined not to have been applied by the memory controller in step (h);

(j) generating an address of the bank to be refreshed next and setting the refreshed bank address to the value of the next address and performing step (g) again if the bank corresponding to the final address is determined not to be being refreshed in step (i);

(k) determining whether a final row address is being refreshed if the bank corresponding to the final address is determined to be being refreshed in step (i);

(l) initializing the refreshed bank address to the initial address, generating a row address to be self-refreshed as the refreshed row address, and performing step (g) again if the final row address is determined not to have been refreshed in step (k);

(m) initializing the refreshed bank address to the initial address, substantially simultaneously initializing the refreshed row address to the initial row address, and performing step (g) again if the final row address is determined to have been refreshed in step (k); and (n) initializing the refreshed bank address to the initial address if the self-refresh completion command is determined to have been applied by the memory controller in step (h).

16. A method of controlling a memory device to substantially simultaneously undergo a refresh operation and another, non-refresh, operation, the memory device being organized into a plurality of banks, the refresh operation progressing on a bank-by-bank basis, the method comprising:

providing a refresh command to the memory device without also providing to the memory device an indication of a corresponding bank address therein initially targeted for refreshing, the refresh command initiating the refresh operation; and providing at least one non-refresh command to the memory device that targets at least one bank in the memory device other than the bank next targeted for refreshing.

17. The method of claim 16, wherein the bank-by-bank refresh operation progresses in the memory device according to a predetermined ordering of the plurality of banks, and wherein the method further comprises:
internally generating, relative to the memory device, the address of the next bank to be refreshed; and
externally generating, relative to the memory device, a shadow address corresponding to the address of the next bank to be refreshed; and wherein the step of providing at least one non-refresh command determines, externally to the memory device, the address of the bank targeted for the non-refresh operation based, in part, upon the shadow address.

18. The method of claim 17, wherein the externally generating step occurs substantially simultaneously with the step of internally generating.

19. The method of claim 17, wherein the step of internally generating uses substantially the same generation technique as the step of externally generating.

20. A memory system comprising:

a memory device organized into a plurality of banks; and a memory controller to control the memory device;

wherein the memory controller is operable to provide a refresh command to the memory device without also providing to the memory device an indication of a corresponding bank address therein initially targeted for refreshing, the refresh command initiating the refresh operation, the refresh operation progressing on a bank-by-bank basis; and wherein the memory controller is operable to provide at least one non-refresh command to the memory device that targets at least one bank in the memory device other than the bank next targeted for refreshing such that the memory device is controlled to substantially simultaneously undergo a refresh operation and the non-refresh operation.

21. The system of claim 20, wherein the bank-by-bank refresh operation progresses in the memory device according to a predetermined ordering of the plurality of banks, and wherein the memory device is operable to generate the address of the next bank to be refreshed; and wherein the memory controller is operable to generate a shadow address corresponding to the address of the next bank to be refreshed; and wherein memory controller is operable to determine the address of the bank targeted for the non-refresh operation based, in part, upon the shadow address.

22. The system of claim 21, wherein the memory device generates the address of the next bank to be refreshed substantially simultaneously with generation of the shadow address by the memory controller.

23. The method of claim 21, wherein the memory device generates the address of the next bank to be refreshed in substantially the same manner that the memory controller generates the shadow address.

* * * * *